United States Patent
Chao et al.

[11] Patent Number: 5,858,879
[45] Date of Patent: Jan. 12, 1999

[54] METHOD FOR ETCHING METAL LINES WITH ENHANCED PROFILE CONTROL

[75] Inventors: L. C. Chao, Tao Yuan; M. H. Huang, Keeling; C. H. Yu, Hsin-Chu, all of Taiwan

[73] Assignee: Taiwan Semiconductor Manufacturing Co., Ltd., Hsin-Chu, Taiwan

[21] Appl. No.: 870,508

[22] Filed: Jun. 6, 1997

[51] Int. Cl.[6] .................................................. H01L 21/302
[52] U.S. Cl. ........................... 438/725; 134/1.2; 438/734; 438/740; 438/16
[58] Field of Search ..................................... 438/714, 721, 438/724, 734, 725, 740, 15, 16; 134/1.2

[56] References Cited

U.S. PATENT DOCUMENTS

| | | | |
|---|---|---|---|
| 5,188,980 | 2/1993 | Lai | 156/659.1 |
| 5,348,619 | 9/1994 | Bohannon et al. | 156/664 |
| 5,702,566 | 12/1997 | Tsui | 156/643.1 |

FOREIGN PATENT DOCUMENTS 6-177091  6/1994  Japan .

OTHER PUBLICATIONS

"An Industrial Plasma Process for Avoiding Charge Effect"; J. Vac. Sci. Tech. B 12(6); 12–1994; pp. 3550–3554; Romand et. al.

"Recovery Phenomenon and Local Field Sensitivity On Wafer Charge–Up Effect of Magnetically Enhanced Reactive Ion Etch System"; Tsui et. al.; IEEE Electron Device Letters vol. 16, No. 2, Feb. 1995; pp. 64–66.

*Primary Examiner*—R. Bruce Breneman
*Assistant Examiner*—George Goudreau
*Attorney, Agent, or Firm*—Tung & Associates

[57] ABSTRACT

The present invention discloses a method for enhancing profile control in a metal line etching process in which a main etching step and an over etching step are used by incorporating a charge neutralization step for the photoresist layer by an inert gas plasma such that plasma ions aimed at the horizontal surface on the semiconductor substrate is not distorted to bombard the sidewalls on the metal lines. The anisotropic etching of the metal lines is improved to provide metal lines on a device that has enhanced profile control and without the void or cavity defect.

20 Claims, 2 Drawing Sheets

METHOD FOR ETCHING METAL LINES WITH ENHANCED PROFILE CONTROL

FIELD OF THE INVENTION

The present invention generally relates to a method for etching metal lines in a semiconductor device and more particularly, relates to a method for etching metal lines with enhanced profile control by adding a neutralization step for discharging the electrostatic charges carried by the photoresist layer by an inert gas plasma between a main etching and an over-etching process for forming the metal lines.

BACKGROUND OF THE INVENTION

In the fabrication of semiconductor devices, particularly in the fabrication of sub-micron scale semiconductor devices, profiles obtained in etching processes are very important. A careful control of the surface etch processes is therefore necessary to ensure directional etching. In conducting an etching process, when an etch rate is considerable larger in one direction than in the other directions, the process is called anisotropic. A reactive ion etching (RIE) process assisted by plasma is frequently used in anisotropic etching of various material layers on top of a semiconductor substrate.

The plasma generated in a RIE process consists of neutrons, ions and electrons. The effect of each species on the etch results and their possible interactions with each other are not well understood. An etch process and the resulting etch products can be analyzed by mass spectrometry, while the chemical compositions on the surfaces can be detected by an in-situ or x-situ x-ray photoelectron spectrometer, Auger spectroscopy and secondary ion mass spectrometry. In plasma enhanced etching processes, the etch rate of a semiconductor material is frequently larger than the sum of the individual etch rates for ion sputtering and neutral etching due to a synergy in which chemical etching is enhanced by ion bombardment.

In an anisotropic etching process, it is clear that the ions striking the surface must themselves be anisotropic, i.e., the ions travel mainly in a direction perpendicular to the wafer surface. The ions are normally oriented and accelerated in a sheath. Proposed mechanisms for anisotropic plasma etching are that first, perpendicular ion bombardment creates a damaged surface that is more reactive toward neutral etchants, and second, ions help to desorb etch-inhibiting species such as etch products from the surface. In either one of the mechanisms, the ion path must be perpendicular to the wafer surface such that only the etch rate of the bottom surface is enhanced. Ideally, the ions should not bombard the sidewalls at all.

In a real plasma etching process, ion-neutral particle collisions from the plasma sheath result in a fraction of the ions bombarding the sidewalls. As a result, lateral etching of the sidewalls occurs to some extent. Theoretically, the number of ion-neutral collisions in the sheath is directly proportional to the sheath thickness and inversely proportional to the ion mean free path. Since the ion means free path is usually proportional to the chamber pressure, reducing the pressure results in reduced ion-neutral collisions and therefore enhances anisotropic etching. Since ions desorb etch-inhibiting species (such as etch products) from the etch surface, the formation of sidewall films (i.e., a passivation layer) during the etching process plays an important role in the development of the anisotropic etch profile. The passivation film protects the sidewalls from etching by non-perpendicular incoming ions.

In an anisotropic etching process, the etch directional control can be enhanced by a mechanism known as sidewall passivation. By adjusting the etchant gas composition and the reactor parameters, an etch-inhibiting film can be formed on the vertical sidewalls. The etch-inhibiting film (or passivation film) slows down or completely stopping lateral attack while the etching of horizontal surfaces (i.e., a bottom surface) proceeds. For instance, in an etch process for silicon, when $O_2$ is added to a $Cl_2$ plasma, an oxide film can be grown on the sidewalls that are not exposed to ion bombardment. Similarly, in a fluorocarbon plasma etching process, a greater elemental ratio of carbon to fluorine can be used to deposit involatile polymer films on the sidewalls thus forming a coating that blocks chemical attack. While polymer film may also deposit on the horizontal surfaces, it is readily removed by the ion bombardment and therefore allowing etching of such surfaces to continue.

The sidewall passivation effect is also observed when an insulating layer such as a photoresist layer deposited on top of a semiconductor substrate is bombarded by plasma ions. On top of the photoresist layer, charge built up occurs during the reactive ion etching process by the severe ion bombardment on the substrate surface. These stored charges can cause a distortion in the ion path bombarded toward the substrate surface. When positive charge accumulates on the wafer surface as a result of impinging ions and emitted secondary electrons, the photoresist surface may be charged up high enough to produce a current flowing through the photoresist layer causing its degradation or other permanent damages. The charge accumulation also causes a distortion in the path of the ion beam by stripping the space-charge compensating electrons from the ion beam. Such charge accumulation further distorts the ion beam path and causes them to collide with the sidewalls of the device.

In a plasma bombardment process conducted on a semiconductor structure covered by a photoresist layer, the plasma ions excited by the bias voltage etch away difficult-to-etch residue materials from the semiconductor substrate, while simultaneously etches a fraction of the photoresist material from the photoresist layer to perform sidewall passivation in order to enhance the anisotropic etching process. In the process where the photoresist material is etched away from the top of the substrate, two steps are normally involved. In the first step, the photoresist material is etched away and separated from the photoresist layer and deposited on the top portion of the sidewalls. The deposited photoresist material is then bombarded again by the plasma ions and sputters to the lower portion of the sidewalls. Since photo resist layer normally consists of a polymeric material and that when it decomposes in plasma, fragments of the polymeric material combine with some of the gas elements in the plasma to form a passivation material for depositing on the sidewalls.

In modern semiconductor devices where spacing between features are continuously being reduced, and when the photoresist layer is highly charged by the plasma, plasma ions that normally bombard in a perpendicular direction with the substrate surface no longer travel in a vertical manner. The paths of the plasma ions are distorted and instead of bombarding the bottom horizontal surface, some of the ions bombard the sidewalls of the etched feature (i.e., a metal line) on the substrate. The sidewall profile is attacked by the ions and as a consequence, the passivation layer coated on the sidewalls for protection purpose is first knocked off by the distorted ions. A chemical etch process by the neutral etchant then etches away the sidewall materials. The smaller the feature size, and thus the smaller the spacing between features on a substrate, the more severe is the plasma ion distortion problem and the sidewall etching problem.

An enlarged, perspective view taken from a SEM micrograph of several metal lines etched on a semiconductor substrate by a conventional etch method is shown in FIG. 1A. Metal lines 10 are formed on the surface of a semiconductor device 12 by a main etching and an over-etching step. In the main etching step, a metal stack of TiN/Al/Cu/TiN/Ti is etched by an etchant mixture of $N_2/BCl_3/Cl_2$ which is superior in etching aluminum lines. The same etchant gas mixture used in etching AlCu and AlCuSi alloys. During the etching process, an excessive charge accumulation on the photoresist layer (not shown) that was deposited on top of the metal layer for the photolithography process distorts the plasma ion paths that was supposedly aimed perpendicularly toward the substrate surface. In ideal situations, only the bottom horizontal surface is to be etched by plasma ions that are not distorted. However, the charges carried by the photoresist layer diverts or distorts the plasma ions such that they bombard the passivation layer (not shown) coated on the sidewalls. After the passivation layer is etched away or severely damaged, etchant gas chemically attacks the metal layer such that voids or cavities 16 are formed. These voids or cavities cause quality problems such that the semiconductor device 12 may not function properly after the manufacturing process is completed.

The etching process for the semiconductor device shown in FIG. 1A is conducted under conditions illustrated in Table I.

TABLE 1

| Step | P mt | TCP W | Bias V | $Cl_2$ | $BCl_3$ | $N_2$ | Ar | seconds |
|---|---|---|---|---|---|---|---|---|
| Main Etch | 10 | 500 | 150 | 75 | 15 | 20 | | End Point |
| Over Etch | 10 | 300 | 150 | 40 | 30 | 10 | | 60 |
| Dechuck | 10 | 100 | 0 | | | | 100 | 10 |

In the main etching process, chamber pressure of 10 m torr is maintained under a TCP power of 500 watts. The bias voltage utilized in the main etching process is approximately 150 volts. An etchant gas mixture for the main etch process consists of 75 sccm $Cl_2$, 15 sccm $BCl_3$ and 20 sccm $N_2$. The etching process is stopped by an end-point mode. After the completion of the main etching process which stops at a metal/TiN interface, an over etching process carried out for approximately 60 seconds is conducted. In the over etching process, a chamber pressure of 10 m torr and a TCP of 300 watts are used. The bias voltage utilized is the same as that used in the main etching process, i.e., 150 volts. The etchant gas used contains less $Cl_2$ and more $BCl_3$ when compared to the etchant gas mixture used in the main etching process, i.e., 40 sccm $Cl_2$, 30 sccm $BCl_3$ and 10 sccm $N_2$. The over etching process etches away the TiN layer at where it is not covered by the photoresist layer. The over etching process is stopped by a time mode at approximately 60 seconds. After the two-step etching process is completed, a dechuck process is carried out in order to eliminate the electrostatic charge on the wafer and to enable the removal of the wafer from the wafer chuck. During the dechuck process, a chamber pressure of 10 m torr is kept and a TCP power of 100 watts is used. No bias voltage is applied. An argon gas is flown into the chamber at a flow rate of approximately 100 sccm. The argon gas dechucks the wafer in approximately 10 seconds so that the wafer can be removed from the etch chamber.

It is therefore an object of the present invention to provide a method for etching metal lines with enhanced profile control that does not have the drawbacks or shortcomings of the conventional etching methods.

It is another object of the present invention to provide a method for etching metal lines with enhanced profile control by eliminating the charge built-up in the photoresist layer deposited on top of a semiconductor structure.

It is a further object of the present invention to provide a method for etching metal lines with enhanced profile control which includes a main etching and an over etching step by incorporating a neutralization step for discharging the charges carried by the photoresist layer.

It is another further object of the present invention to provide a method for etching metal lines with enhanced profile control wherein the etching process includes a main etching step which stops at a metal/TiN interface.

It is yet another object of the present invention to provide a method for etching metal lines with enhanced profile control wherein the etching process includes an over etching step for etching the metal lines through a TiN layer.

It is still another object of the present invention to provide a method for etching metal lines with enhanced profile control wherein the metal layer is deposited of a material of Al, AlCu or AlCuSi.

It is still another further object of the present invention to provide a method for etching metal lines with enhanced profile control wherein the metal lines consist of a metal stack of TiN/metal/TiN/Ti with the Ti layer next to the semiconductor substrate.

It is yet another further object of the present invention to provide a method for etching metal lines with enhanced profile control wherein a photoresist layer deposited on a metal layer generates a passivation material for coating the sidewalls of the metal line when bombarded by a gas plasma.

It is still another further object of the present invention to provide a method for etching metal lines with enhanced profile control by neutralizing charges build up in a photo-resist layer by an inert gas plasma of argon or helium.

SUMMARY OF THE INVENTION

In accordance with the present invention, a method for etching metal lines in a semiconductor structure which provides enhanced profile control can be carried out by adding a charge neutralization step for a photoresist layer deposited on top of the metal layer between a main etching process and an over etching process such that the plasma ion paths of the ions are not distorted by the charges carried by the photoresist layer.

In a preferred embodiment, a method for etching metal lines with enhanced profile control is provided by the operating steps of first providing a semiconductor device that has a metal layer deposited on top, then depositing and patterning a photoresist layer on top of the metal layer, then plasma etching lines in the metal layer and stopping at a metal/TiN interface in a first etching step, then neutralizing charges in the photoresist layer by an inert gas plasma, and plasma etching the lines through the TiN layer in a second etching step.

In another preferred embodiment, the present invention novel method for enhancing profile control in a metal line etching process can be carried out by the steps of first providing a semiconductor device that has a metal layer deposited on top, then depositing and patterning a photoresist layer on top of the metal layer, wherein the photoresist layer produces a passivation material in a gas plasma, then anisotropically etching lines in the metal layer in a first etching step stopped by an end-point mode, then neutralizing electrostatic charge built-up in the photoresist layer by an inert gas plasma, and anisotropically etching the lines in a second etching step stopped by a time mode.

BRIEF DESCRIPTION OF THE DRAWINGS

These and other objects, features and advantages of the present invention will become apparent from the following detailed description and the appended drawings in which.

DETAILED DESCRIPTION OF THE PREFERRED EMBODIMENT

The present invention discloses a method for etching metal lines with enhanced profile control wherein the etching, process includes a main etching step and an over etching step by incorporating a charge neutralization step on a photoresist layer which is deposited on top of a metal layer between the main etching step and the over etching step such that the plasma ion path is not distorted by the charges carried in the photoresist layer.

Figure 2A:
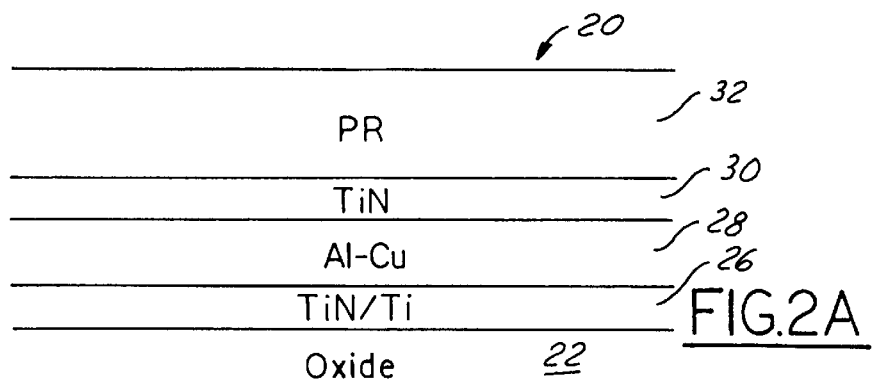
FIG. 2A is an enlarged, cross-sectional view of a present invention semiconductor structure having a photoresist layer deposited on top of a metal stack before the etching process.

Referring initially to FIG. 2A, wherein an enlarged, cross-sectional view of a present invention semiconductor structure 20 is shown. As shown in FIG. 2A, the semiconductor structure 20 is constructed sequentially by the following layers deposited on an oxide insulating layer 22, first a Ti layer 24 is deposited as an adhesion promotion (or a glue). The thickness of the titanium layer can be between about 100 Å and about 600 Å, and preferably between about 200 Å and about 400 Å. The titanium layer 24 is then exposed to a nitrogen atmosphere such that a layer of TiN is formed as a barrier layer. The TiN layer prevents electromigration of aluminum toward the semiconducting substrate. The thickness of the TiN layer can be between about 500 Å and about 1500 Å, and preferably between about 800 Å and about 1200 Å. The TiN/Ti layer 24 can be deposited by a physical vapor deposition technique. On top of the TiN layer, an aluminum layer is deposited to a thickness between about 2000 Å and about 8000 Å, and preferably between about 3000 Å and about 5000 Å. Other aluminum alloys such as AlCu or AlCuSi which contains small amount of Cu or Cu and Si can also be suitably used in the present invention method as the metal layer 28. The metal layer is normally deposited by a physical vapor deposition technique.

On top of the metal layer 28, a second TiN layer 30 which has a thickness range between about 1000 Å and about 2000 Å, and preferably between about 1200 Å and about 1600 Å is deposited. The second TiN layer 30 is used as an anti-reflective coating (ARC) layer. It improves the photolithographic method such that a more accurate image can be produced from a mask. In a final step, a photoresist layer 32 is deposited over the TiN layer 30. The thickness of the photoresist layer 32 can be between 10,000 Å and about 20,000 Å, and more preferably between about 12,000 Å and about 14,000 Å. The photoresist layer 32 used most likely contains a polymeric base such that fragments of the polymer containing carbon and nitrogen are produced to passivate the sidewalls subsequently formed.

Figure 2B:
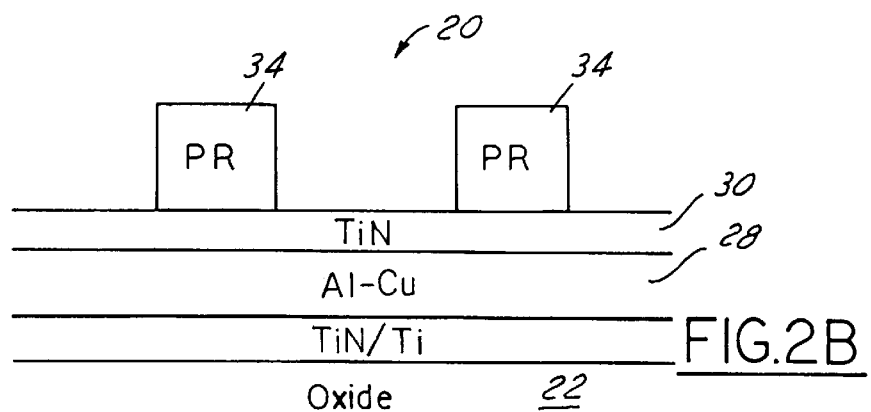
FIG. 2B is an enlarged, cross-sectional view of the present invention semiconductor structure shown in FIG. 2A with the photoresist layer patterned.
Figure 2C:
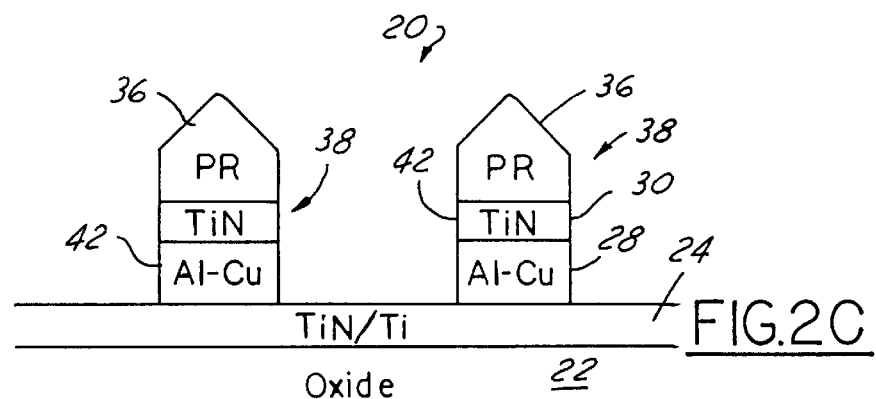
FIG. 2C is an enlarged, cross-sectional view of the present invention semiconductor structure of FIG. 2B after a main etching step is executed on the structure.

In the next step, as shown in FIG. 2B, the photoresist layer 32 is patterned by exposing to a UV light of a suitable wavelength. The patterned photoresist 34 defines the metal lines to be formed under the photoresist layer 34. It has a width which is the same as that for the metal lines to be formed.

On the structure shown in FIG. 2B, a main etch process is conducted in an etcher by using an etchant gas mixture of $Cl_2$, $BCl_3$ and $N_2$. In this main etching step, the process conditions are shown in Table II.

TABLE 2

| Step | P mt | TCP W | Bias V | $Cl_2$ | $BCl_3$ | $N_2$ | Ar | seconds |
|---|---|---|---|---|---|---|---|---|
| Main Etch | 10 | 500 | 150 | 75 | 15 | 20 | | EP |
| Neutralization | 10 | 100 | 0 | | | | 100 | 10 |
| Over Etch | 10 | 300 | 150 | 40 | 30 | 10 | | 60 |
| Dechuck | 10 | 100 | 0 | | | | 100 | 10 |

Figure 1A:
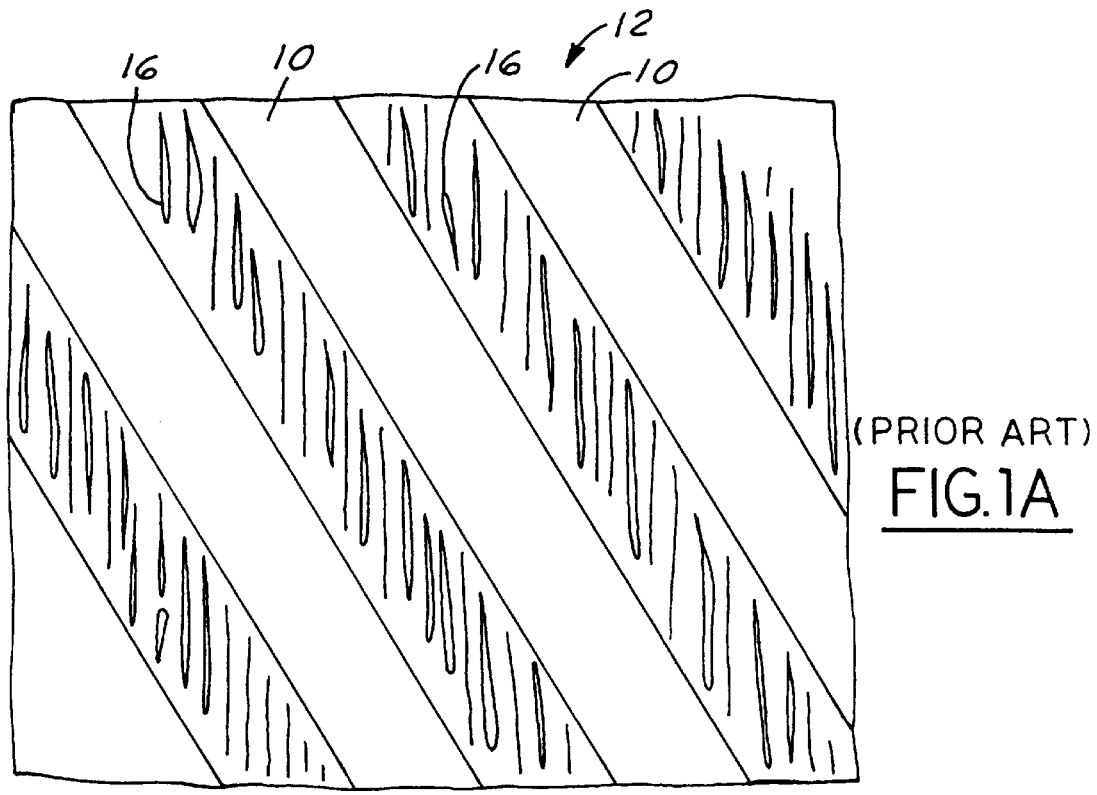
FIG. 1A is an illustration taken from a SEM micrograph showing an enlarged, perspective view of metal lines formed on a semiconductor substrate by a conventional etch process.

In the main etching process, the plasma ion bombardment on the photoresist layer 34 (FIG. 2B) etches away fragments of the photoresist layer such that they react with some gas components contained in the gas plasma and form a passivation layer on the sidewalls 42 of the metal stack 38. During the main etching process, high density plasma ions bombard the photoresist layer 36 such that electrical charges are accumulated in the photoresist layer 36. The heavily charged photoresist layers 36 distorts the perpendicular path of the plasma ions that were aimed at the bottom 44 on the TiN/Ti layer. The distortion produces an end result that the sidewalls 42 of the metal stacks 38 are attacked into forming voids and cavities (as those shown in FIG. 1A). The main etching process is stopped by an end-point mode in which the aluminum emission signals are closely monitored and that the etching is stopped as soon as a drastic reduction of the aluminum content is indicated. Such end-point indicates that the surface between aluminum and TiN has been reached.

The present invention novel method of incorporating a neutralization step to discharge the electrostatic charges formed in an photoresist layers 36 can be carried out immediately after the main etching process is completed. During the neutralization step, a plasma of an inert gas is generated such that the charges carried by the photoresist layer 36 may be discharged. It has been found that a suitable neutralization process can be carried out at a chamber pressure of approximately 10 m torr, a TCP of 100 watts and a zero bias voltage. The inert gas used can be selected from argon or helium which is flown into the chamber at 100 sccm, even though a flow rate between about 50 sccm and about 500 sccm can be suitably used. The neutralization by argon gas (as illustrated in Table 2) can be carried out by flowing Ar through the chamber for a time period of 10 seconds. Any other suitable time such as between about 5 seconds and about 60 seconds can be used.

The argon plasma is used to neutralize the charges carried on the surface of the photoresist layer 36. After the charges are neutralized, the accumulated charges in the subsequent over etching process is not enough for causing any distortion problems in the plasma ion path. Argon is selected as an ideal inert gas material for the present invention method since it can be easily ionized. It has also been used as a dechuck gas.

Figure 2D:
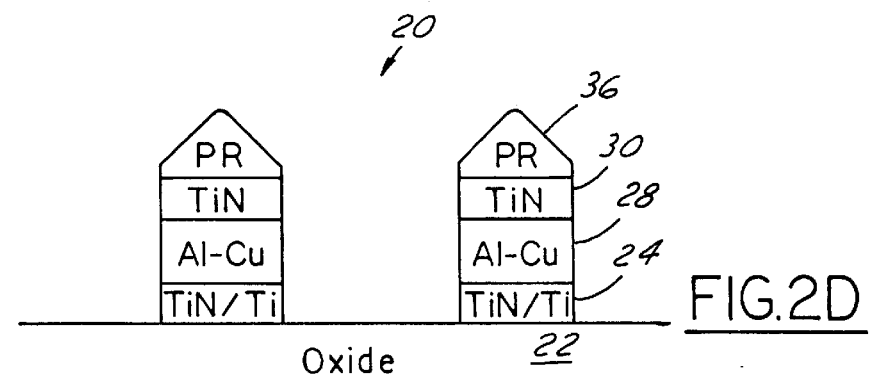
FIG. 2D is an enlarged, cross-sectional view of the present invention semiconductor structure of FIG. 2C after a neutralization step and an over etching step are conducted on the structure.

After the completion of the neutralization step, an over etching step can be conducted to produce the semiconductor structure shown in FIG. 2D. The over etching step can be carried out at a suitable chamber pressure of approximately 10 m torr, a suitable TCP at approximately 300 watts and a bias voltage of approximately 150 volts. The etchant gas used in the over etching step is similar to that used in the main etching step however, at different flow rates. For instance, in the over etching step, a $Cl_2$ gas is flown into the chamber at approximately 40 sccm, a $BCl_3$ gas is flown into the chamber at approximately 30 sccm, and a $N_2$ gas is flown into the chamber at approximately 10 sccm. The total time required for the over etching step is approximately 60 seconds. In the over-etching step, the TiN/Ti layer 24 that is over the oxide layer 22 and not covered by the metal stack 38 is etched away. A dechucking step is then carried out at a chamber pressure of 10 m torr, a TCP of 100 watts, and at zero bias voltage. During the dechucking process, argon gas is flown into the chamber at 100 sccm for a time period of approximately 10 seconds.

Figure 1B:
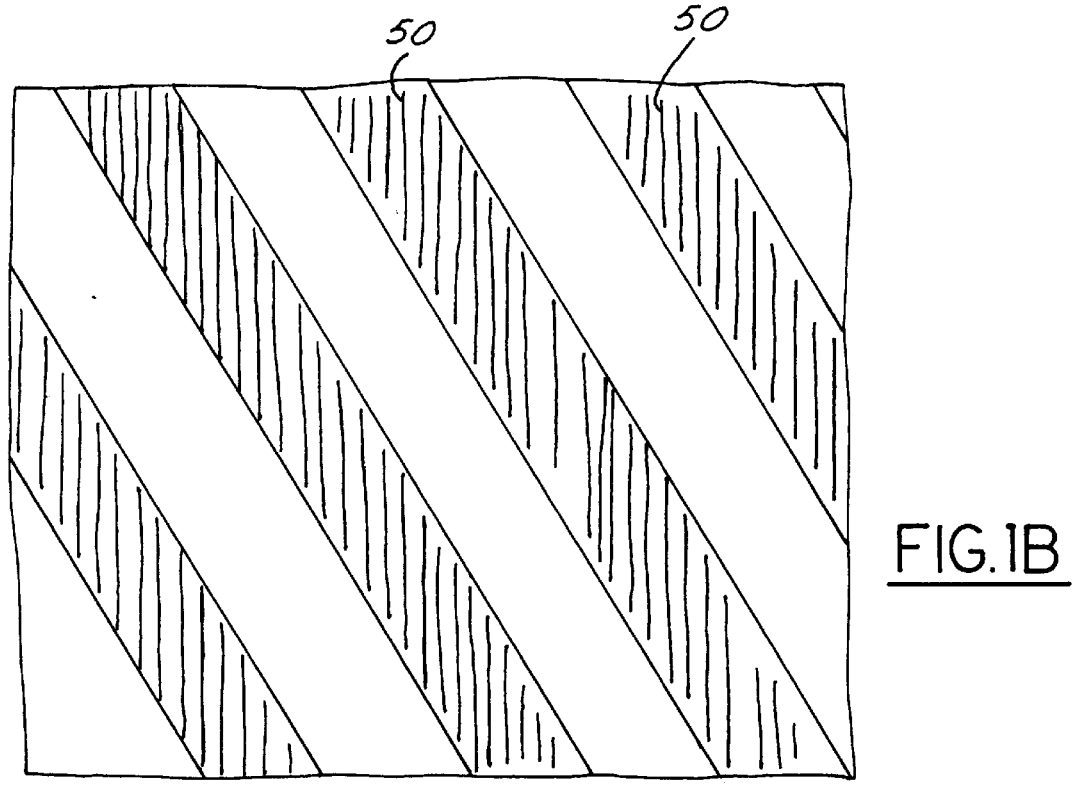
FIG. 1B is an illustration taken from a SEM micrograph showing an enlarged, perspective view of metal lines formed by the present invention etch process incorporating a charge neutralization step.

An enlarged, perspective view taken from a SEM micrograph of metal lines etched by the present invention method incorporating the photoresist neutralization process is shown in FIG. 1B. It is seen that a smooth profile on the sidewalls 50 is obtained without any of the cavities or voids previously seen in FIG. 1A.

It should be noted that the etchant gas mixture shown above is for illustration only, any other etchant gas mixture can be used for any other metal lines. In the present etchant gas mixture, the $Cl_2$ content is used for etching the aluminum metal, the $BCl_3$ content is used for the physical passivation or the bombardment of the photoresist layer such that fragments of the layer can be sputtered onto the sidewalls forming passivation. Since most photoresist materials used are of polymeric base and therefore carbon containing, a polymeric based passivation layer is frequently deposited on the sidewalls of the metal lines for passivation. The $N_2$ gas used in the present invention etchant gas mixture is for chemical passivation which when combined with carbon passivates the sidewalls of the metal lines chemically. Since plasma generation is frequently affected by the design of the equipment and the etchant gas utilized, a different plasma should be used for a different metal material to achieve different process variables or parameters. The enhanced profile control achieved by the present invention novel method is therefore amply illustrated in the representation of the SEM micrograph shown in FIG. 1B.

While the present invention has been described in an illustrative manner, it should be understood that the terminology used is intended to be in a nature of words of description rather than of limitation.

Furthermore, while the present invention has been described in terms of a preferred embodiment, it is to be appreciated that those skilled in the art will readily apply these teachings to other possible variations of the inventions.

The embodiment of the invention in which an exclusive property or privilege is claimed are defined as follows:

1. A method for etching metal lines with enhanced profile control comprising the steps of:
   providing a semiconductor device having a metal layer deposited on top,
   depositing and patterning a photoresist layer on top of said metal layer,
   plasma etching lines in said metal layer and stopping at a metal/TiN interface in a first etching step,
   neutralizing charges in said photoresist layer by an inert gas plasma, and
   plasma etching said lines through said TiN layer in a second etching step.

2. A method according to claim 1, wherein said metal layer comprises a metal stack of TiN/Metal/TiN/Ti with the Ti layer next to the semiconductor device.

3. A method according to claim 1, wherein said metal layer is deposited of a material selected from the group consisting of Al, AlCu and AlCuSi.

4. A method according to claim 1, wherein said photoresist layer generates a passivation material when bombarded by a gas plasma.

5. A method according to claim 1, wherein said photoresist layer generates a passivation material for coating the sidewalls of the metal line when bombarded by a gas plasma of $N_2$, $BCl_3$ or $N_2/BCl_3$.

6. A method according to claim 1, wherein said first etching step is stopped by an end-point mode.

7. A method according to claim 1, wherein said second etching step is stopped by a time mode.

8. A method according to claim 1, wherein said first etching step is a main etching step and said second etching step is an over-etching step.

9. A method according to claim 6, wherein said first etching step is stopped when a drop in Al emission is detected in an end mode.

10. A method according to claim 7, wherein said second etching step is stopped after between about 30 seconds and about 120 seconds.

11. A method according to claim 1, wherein said inert gas plasma is an argon plasma or a helium plasma.

12. A method according to claim 1, wherein said neutralization step for said charges in the photoresist layer substantially eliminates distortion in ion paths during said second plasma etching step.

13. A method for enhancing profile control in a metal line etching process comprising the steps of:
   providing a semiconductor device having a metal layer deposited on top,
   depositing and patterning a photoresist layer on top of said metal layer, said photoresist layer produces a passivation material in a gas plasma,
   anisotropically etching lines in said metal layer in a first etching step stopped by an end-point mode,
   neutralizing electrostatic charges built-up in said photoresist layer by an inert gas plasma, and
   anisotropically etching said lines in a second etching step stopped by a time mode.

14. A method according to claim 13, wherein said metal layer comprises a metal stack of TiN/Metal/Tin/Ti with the Ti layer contacting said semiconductor substrate.

15. A method according to claim 13, wherein said metal layer is deposited of a material selected from the group consisting of Al, AlCu and AllCuSi.

16. A method according to claim 13, wherein said inert gas plasma is generated by argon or helium.

17. A method according to claim 13, wherein the plasma that produces the passivation material is generated by $N_2$, $BCl_3$ or $N_2/BCl_3$.

18. A method according to claim 13, wherein said first and said second etching steps are conducted in a reactive ion etching chamber.

19. A method according to claim 13, wherein said first and said second etching steps are carried out by an etchant gas mixture of $Cl_2$, $BCl_3$ and $N_2$.

20. A method according to claim 14, wherein said first and said second etching steps are carried out for a time period sufficient to remove substantially all the metal stack.

* * * * *